United States Patent [19]

Takahashi

[11] Patent Number: 5,731,999

[45] Date of Patent: Mar. 24, 1998

[54] METHOD OF CONTROLLING CLAMP INDUCED RINGING

[75] Inventor: Duane M. P. Takahashi, San Jose, Calif.

[73] Assignee: Apple Computer, Inc., Cupertino, Calif.

[21] Appl. No.: 383,030

[22] Filed: Feb. 3, 1995

[51] Int. Cl.$^6$ .................................................. G06G 7/48
[52] U.S. Cl. .......................... 364/578; 364/488; 327/524; 327/574; 327/583; 327/104; 323/280; 323/314
[58] Field of Search .............................. 327/325, 314, 327/596, 592, 558, 551, 311, 310, 104, 524, 574, 583, 170, 50, 512, 535, 542, 284, 530, 544, 546, 309, 322, 328; 331/167; 364/578, 488, 489, 490, 491; 323/280, 314, 907; 348/682, 683; 257/473, 280, 281, 486, 359, 360, 361

[56] References Cited

U.S. PATENT DOCUMENTS

| | | | |
|---|---|---|---|
| 3,936,599 | 2/1976 | Peil et al. | 348/682 |
| 3,984,830 | 10/1976 | Buchanan et al. | 341/136 |
| 4,500,798 | 2/1985 | Pike | 327/574 |
| 4,677,369 | 6/1987 | Bowers et al. | 323/314 |
| 4,678,947 | 7/1987 | Huijsing et al. | 327/50 |
| 5,357,156 | 10/1994 | Herrington | 327/310 |
| 5,359,534 | 10/1994 | Fujiki et al. | 364/578 |
| 5,381,345 | 1/1995 | Takegami et al. | 364/578 |
| 5,446,676 | 8/1995 | Huang et al. | 364/578 |
| 5,452,225 | 9/1995 | Hammer | 364/578 |
| 5,471,409 | 11/1995 | Tani | 364/578 |
| 5,510,749 | 4/1996 | Arimoto | 327/546 |
| 5,525,829 | 6/1996 | Mistry | 257/473 |
| 5,537,073 | 7/1996 | Arimoto | 327/546 |
| 5,553,008 | 9/1996 | Huang et al. | 364/578 |

Primary Examiner—Jacques Louis-Jacques
Attorney, Agent, or Firm—Paul D. Carmichael; David J. Larwood

[57] ABSTRACT

A method of designing improved CMOS input circuits by understanding and selecting appropriate drive strength for a CMOS output from a previous stage. The method involves modeling the net using HSPICE and including a transit time term to accurately model charge storage, then size drivers as needed to keep the $V_{ss}$ clamps out of forward conduction. Excessive ringing can cause data errors in the input stage if unterminated, falling edge transitions in such a net can turn on a receiver's $V_{ss}$ clamp diode (stored charge in the $V_{ss}$ clamp diode combined with the line's inductance and the receiver's capacitance form an energized resonant circuit which can release energy at a time to cause a data glitch). Currently, XNS simulation miscalculates the ring amplitude by a factor of three. Driver scaling and termination can eliminate the problem by keeping the receiver's $V_{ss}$ clamp out of forward conduction. Driver sizing can control the problem. Lower current will turn the clamp on for a shorter amount of time, and change the position of the ring. Improved modeling or simulation can allow selection of correct driver sizes and other circuit elements.

2 Claims, 7 Drawing Sheets

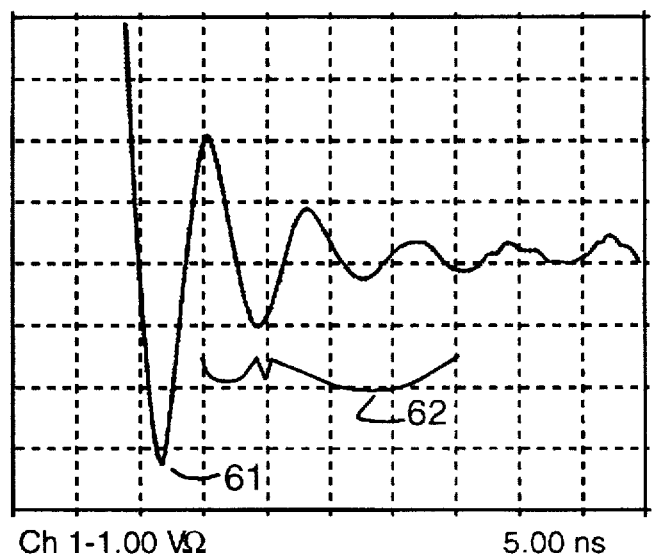
FIGURE 6
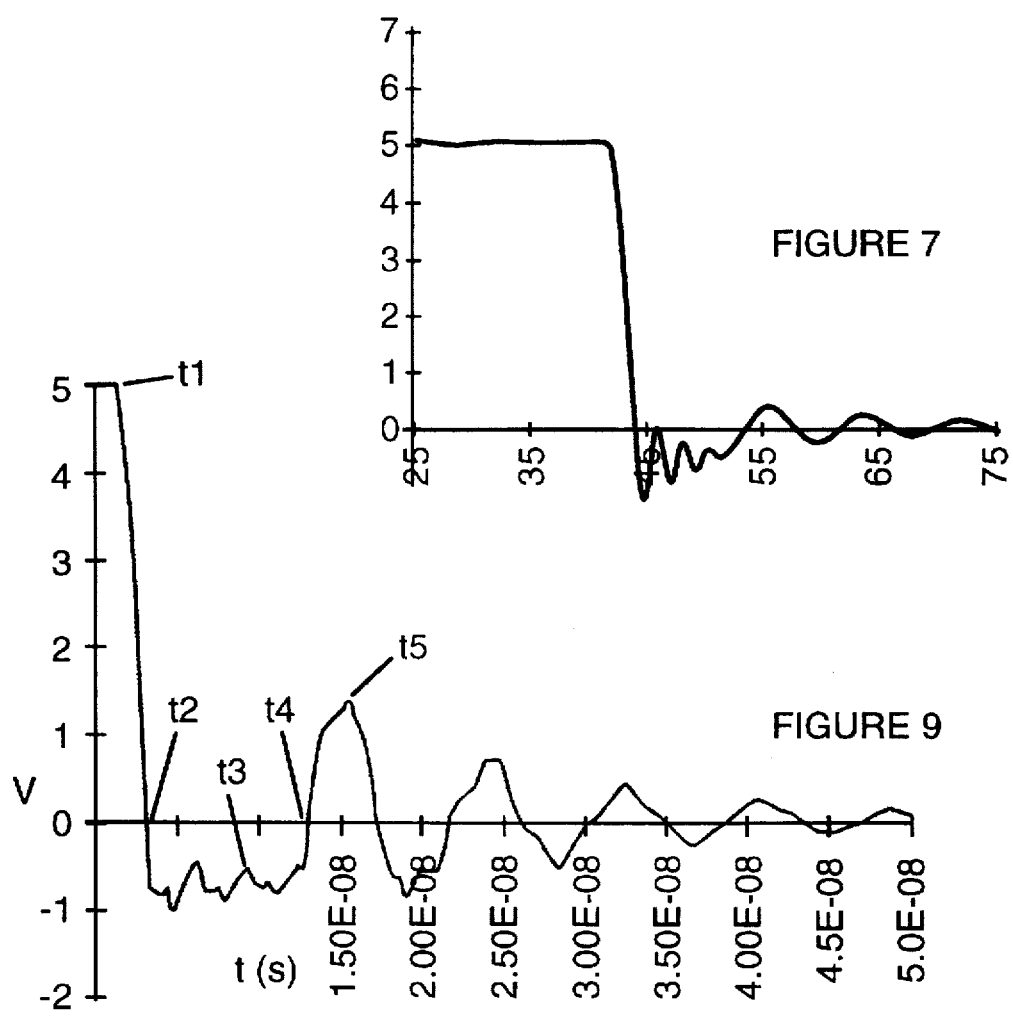
FIGURE 7
FIGURE 9

METHOD OF CONTROLLING CLAMP INDUCED RINGING

FIELD OF THE INVENTION

This invention relates to the field of designing CMOS device inputs, particularly inputs protected by clamp diodes.

BACKGROUND OF THE INVENTION

It is common practice to protect a CMOS device input with clamp diodes, typically connecting a diode from the input to Vdd and connecting a second diode from the input to ground. These diodes turn on if the input voltage exceeds Vdd or falls below 0V by more than a small amount and prevent overdriving the input. Without the clamp diodes, an input spike can induce a large current in the CMOS input stage and damage or destroy the input stage (CMOS latch up).

Referring to FIG. 1, a typical, prior art CMOS input circuit includes a clamp diode to each rail. A transmitter or source device such as driver 10 is connected by line 11 to input 12 of a receiver, CMOS device 13. CMOS device 13 is connected in turn to Vdd 14 and ground 15. Clamp diode 16 is connected between input 12 and Vdd 14 and conducts when the input voltage at input 12 exceeds Vdd plus about 0.7V (a diode turn-on voltage). Clamp diode 17 is connected between input 12 and ground 15 and conducts when the input voltage falls below about −0.7V (ground minus a diode turn-on voltage). Clamp diode 17 includes a parasitic capacitance, illustrated by capacitor 18.

In designing a circuit, a common feature is a connection from an output of one device, typically a CMOS (or other) device, to the input stage of another CMOS device. A large (i.e. powerful) output driver will propgate the signal as quickly as possible, with sharp, well defined edges. In one common operating mode, the input is precharged to Vdd and the output stage drives the input line low. This falling edge propgates along the line until it reaches the input. In an unterminated system, the edge reflects, tending to drive the input below ground (and induce excess current in the CMOS input stage), but the clamp diode turns on as soon as the level reaches −0.7V and shunts excess current to ground.

In some such circuits, a late ring pulse is observed. Depending on the specific design, this ring easily can exceed minimum logic thresholds and be read as something other than "0". If the position of the ring is such that the indeterminate level may be clocked as the input, erroneous data may be entered. This is particularly problematic as system clock speeds increase. In particular, a system operating at 50 MHz has a clock every 20 ns. If the output stage includes an 8–10 ns gate delay and the late ring pulse comes about 10–12 ns later, this pulse can coincide with the next clock and lead to data errors.

SUMMARY OF THE INVENTION

Unterminated, falling edge transitions can turn on a receiver's Vss clamp diode and cause excessive ringing. Stored charge in the Vss clamp diode combined with the line's inductance and the receiver's capacitance form an energized resonant circuit. This energy is released in the form of a clamp induced ring of significant amplitude.

Driver scaling and termination can eliminate the problem by keeping the receiver's Vss clamp out of forward conduction. Adding a series resistor will eliminate the problem, but introduces other problems such as slowing propagation and unsharpening edge transitions.

The problem can be controlled by modifying or carefully specifying driver sizing. A weaker driver will turn the clamp on for a shorter amount of time, and change the position of the ring, and possibly lower the ring's amplitude. On nets with multiple loads and drivers, stubs can sometimes, but not always, break up the single inductor and spoil the resonant characteristics, thereby reducing or preventing the ring.

The analysis below is for a lumped circuit, but clamp induced ringing can also occur on transmission lines. Reflected voltage and current waves would take the place of the charged inductor and capacitor.

One object of the present invention is to provide a method of analysis to identify and mitigate clamp induced ringing.

Another object of this invention is to provide a circuit that will minimize clamp induced ringing.

BRIEF DESCRIPTION OF THE DRAWINGS

FIG. 6 shows the waveform for the same net but terminated with a capacitor instead of the input section.

FIG. 7 shows an XNS simulation of the clamp's on time and ring period.

FIG. 9 shows an HSPICE simulation using the HSPICE level 1 diode model, and setting the transit time to 5 ns, which generates about 2V of initial ring amplitude. (Vcap, tt=5 ns.)

DETAILED DESCRIPTION OF THE INVENTION

Unterminated, falling edge transitions can turn on a receiver's Vss clamp diode and cause excessive ringing. Stored charge in the Vss clamp diode combined with the line's inductance and the receiver's capacitance form an energized resonant circuit. This energy is released in the form of a clamp induced ring of significant amplitude.

Observations

Figure 1:
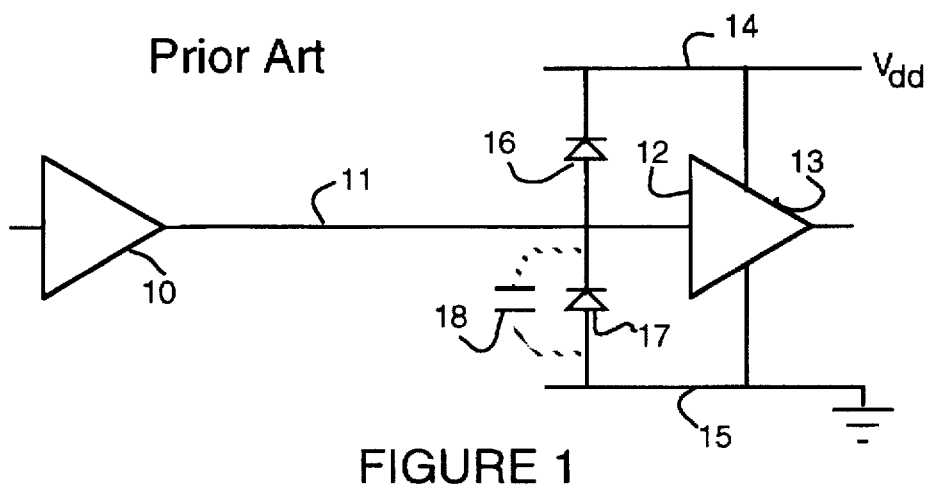
FIG. 1 shows a typical, prior art CMOS input circuit with a clamp diode to each rail.
Figure 2:
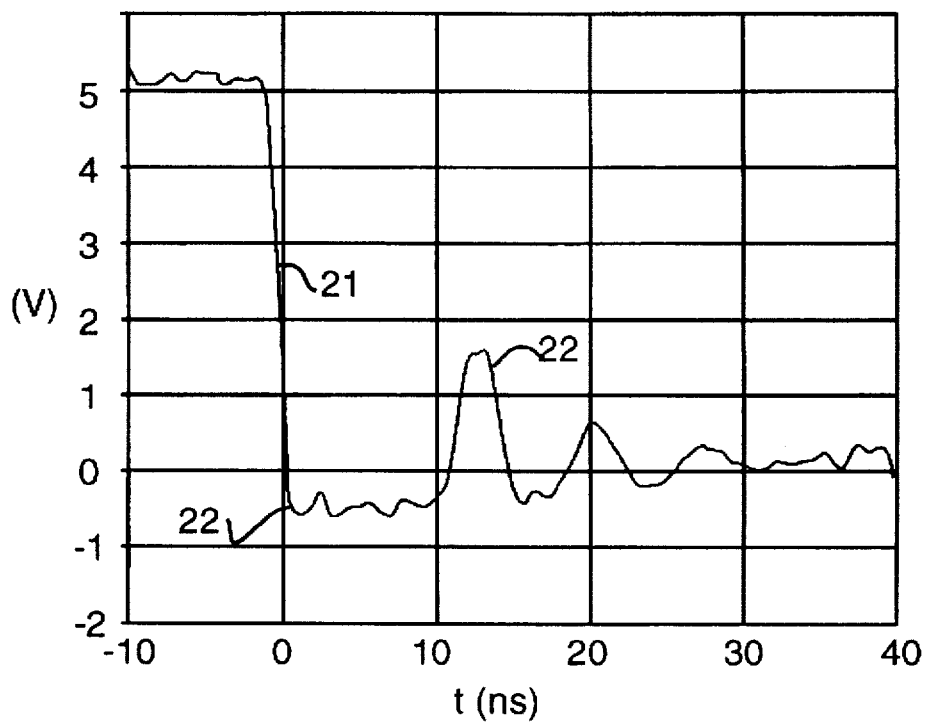
FIG. 2 shows the clamp induced ringing in line BanBG. This waveform is from the receiver of an unterminated, point-to-point net.

FIG. 2 shows the clamp induced ringing on representative line BanBG. This waveform is from the receiver of an unterminated, point-to-point net. The round trip time is approximately 2 ns. Note ringing 22, which is now recognized to be clamp induced ringing.

The Vss clamp turns on immediately after the falling edge 21 (at about −0.7V, 22). Note that the ring period greatly exceeds the round trip delay. The ringing is not due to crosstalk or ground bounce.

Figure 3:
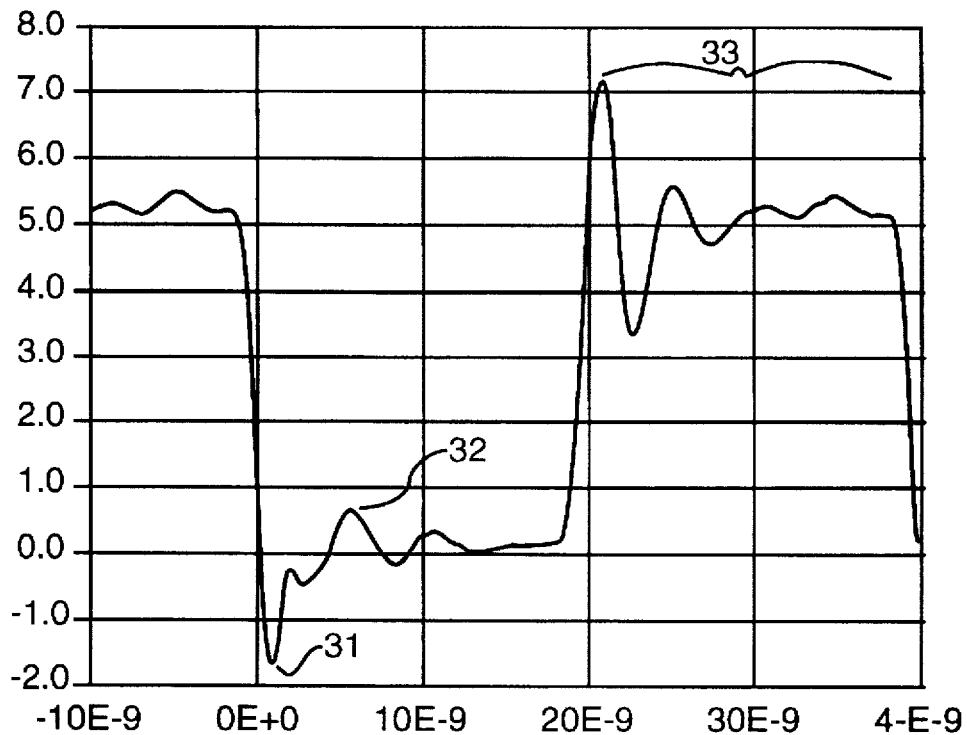
FIG. 3 shows fie relative absence of clamp induced ringing in a different circuit.

FIG. 3 shows the relative absence of clamp induced ringing in a different circuit. FIG. 3 is from 2X_PCLK, pin 282 of the PowerPC 601 microprocessor (available from Motorola, Phoenix, Ariz.) ("601"). A 25 MHz ASIC output drove this pad directly. There was no series resistor between the ASIC output and the 601, and the net was approximately three inches long. The 601 Vss clamp is slower than the TI clamp (compare FIG. 2 and FIG. 3), but the net still shows some clamp induced ringing 32 after rising. The rising edge shows an unclamped ring.

Experiments

All data are from actual ASICs on a prototype board. The general phenomenon has been observed previously, but the source of the problem has not been identified and no solution has been proposed before this invention.

Both driver and receiver are Texas Instruments (TI) ASICs. The driver is an ASIC incorporating TI library cell OPJB3 (low-noise, TTL, 12/24 mA output). The receiver is a second ASIC incorporating TI library cell IPI01 (CMOS level input buffer).

Figure 4:
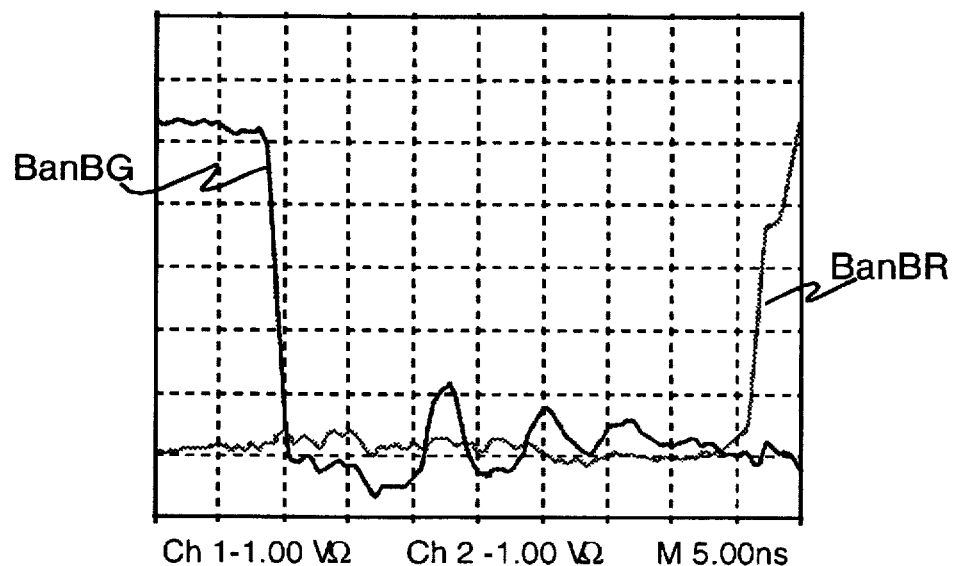
FIG. 4 shows an adjacent line, BanBR, with no sign of the ring.

FIG. 4 shows an adjacent line, BanBR, with no sign of the ring after the falling edge of BanBG (the line illustrated in FIG. 2). BanBR is unaffected during the ring, and rises 35 ns after the falling edge of BanBG. XNS simulation identified all the coupling nets within 15 mils of BanBG, and there was no ringing on those nets.

Figure 5:
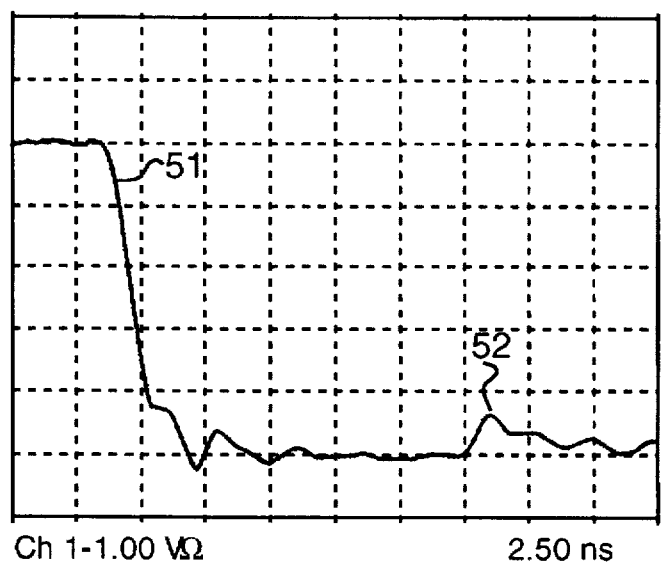
FIG. 5 shows BanBG at the driver.

FIG. 5 shows BanBG at the driver. Approximately 13 ns after the falling edge 51 there is a small runt pulse 52 that corresponds with the ringing seen at the receiver. The drive device is quiet during the ring, so there is no ground bounce.

The currents responsible for the ring are about 30–40 mA. The driver's output impedance is ~10Ω. Therefore, a 400 mV runt pulse is reasonable.

Lifting the receiver pin and inserting a 10 pF capacitor to ground demonstrates the clamping action. FIG. 6 shows the waveform at the capacitor. The ringing 62 and large undershoot 61 are typical of a capacitively loaded line.

Simulations

The circuit was simulated using two different analog waveform simulation tools. One tool was the XNS tool from Quad Design (Camarillo, Calif.). Another tool was the traditional HSPICE tool, available from Meta-Software, Inc. (Campbell, Calif.).

XNS can simulate the clamp's on time and ring period. However, XNS is off by a factor of three in the initial ring amplitude, and there is currently no work-around to correctly simulate the actual, measured waveforms. The XNS clamp model is an IV curve with no time domain effects. FIG. 7 shows the XNS results. The XNS results look similar to the capacitively loaded line shown in FIG. 6.

Figure 8:
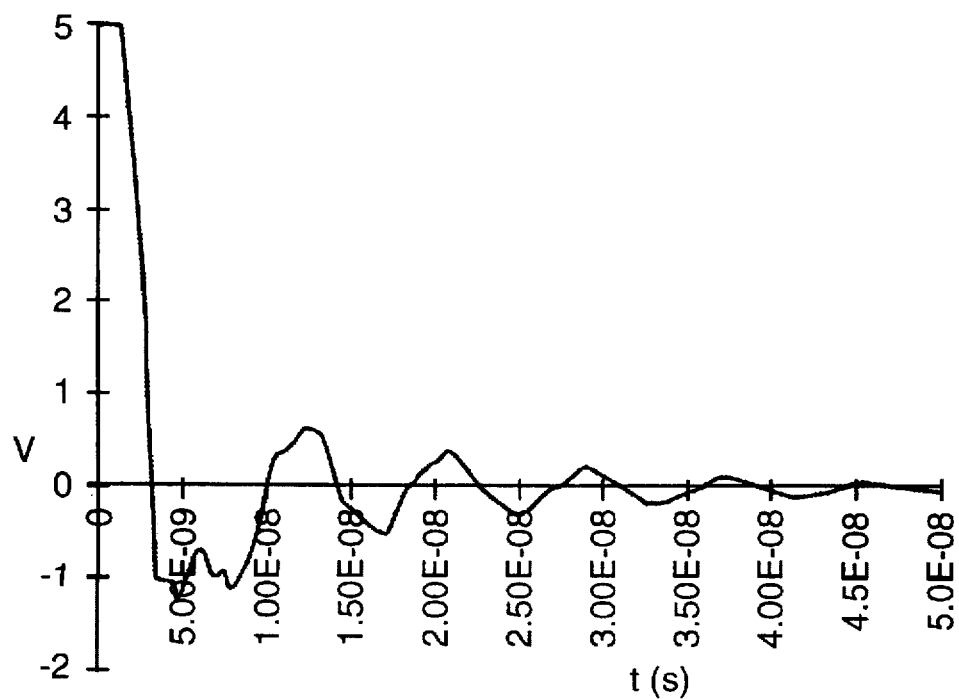
FIG. 8 shows an HSPICE simulation without charge storage. (Vcap, no charge storage.)

FIG. 8 shows the HSPICE results without charge storage. The input deck is similar to the XNS simulation of FIG. 7.

Figure 16:
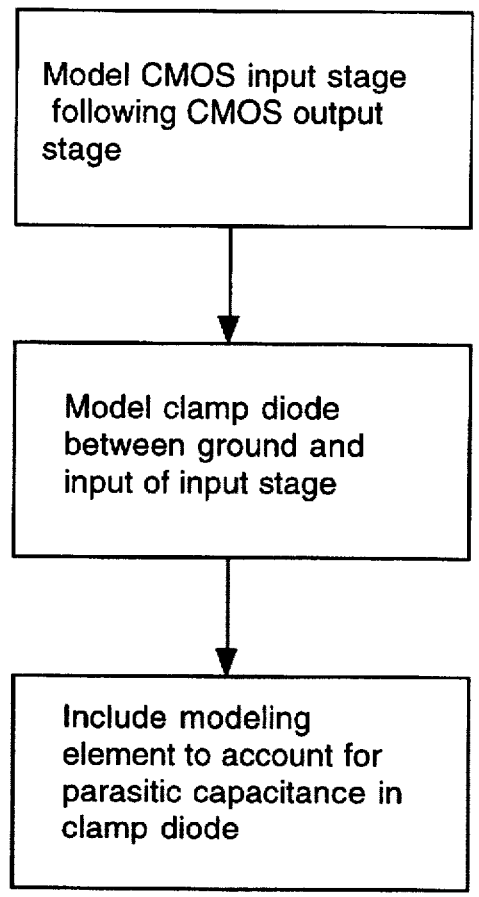
FIG. 16 illustrates the method of this invention for including a modeling term for parasitic capacitance in the clamp diode.

A parasitic capacitance on the clamp diode can be modeled by including a transit time in the HSPICE deck see FIG. 16, generally. Using the HSPICE level 1 diode model, and setting the transit time to 5 ns generates about 2V of initial ring amplitude. FIG. 9 shows the HSPICE results. The HSPICE deck is reproduced below.

HSPICE Deck
Simple LC model

```
.tran .01ns 50ns
.option post=1 brief ingold=1
vin     1  0  pulse (5v 0 0 2ns 2ns 50ns 100ns)
rout    1  2  10
Tcoax   2  0  3 0 Z0 = 68 L = 0.25 TD = 5.8n
v_line  4  3  0
L_pkg   4  5  9nH
C_term  5  6  10pF
v_cap   0  6  0
D1      7  5     Discrete 10u 10u
v_dio   0  7  0
.print v(4) i(v_dio) i(v_line) i(v_cap)
.model Discrete D (level=1, Is=17.2p, Rs=20u, TT=5ns)
*.model Discrete D (level=1)
.end
```

Lumped Approximation

The measured propagation delay is 1 ns. The driver's fall time is approximately 2 ns, so the net behaves more like a lumped circuit than a transmission line. The measured ring period is 7.2 ns. The following relationship gives the ring period for a dlamped LC circuit:

$$t_{ring} = 2\pi \sqrt{\frac{LC}{1 - \frac{1}{Q^2}}}$$

H. Johnson and M. Graham *High-Speed Digital Design*. Englewood Cliffs, N.J.: Prentice-Hall, Inc., 1993, p.135.

L and C are the line's lumped inductance and capacitance, and Q is:

$$Q = \frac{\sqrt{\frac{L}{C}}}{R}$$

*Ibid*, p. 136.

R is the driver's output impedance. Using XNS's transmission line parameter file, L=59 nH
C=12 pF Adding 9 nH and 10 pF for the package parasitics results in Q=5.6
$t_{ring}$=7.8 ns This agrees with the measured 7.2 ns.

Charge Flow

Figure 10:
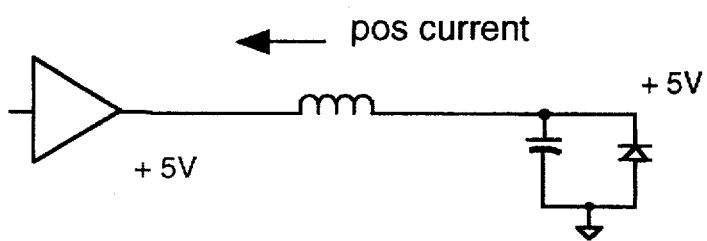
FIG. 10 shows the simplified circuit precharged to +5V.

FIG. 10 shows the simplified circuit precharged to +5V. (The HSPICE model uses a transmission line section for the net and includes package inductance.) The clamp is initially reverse biased and discharged. Note the direction of positive current is out of the load.

Figure 11:
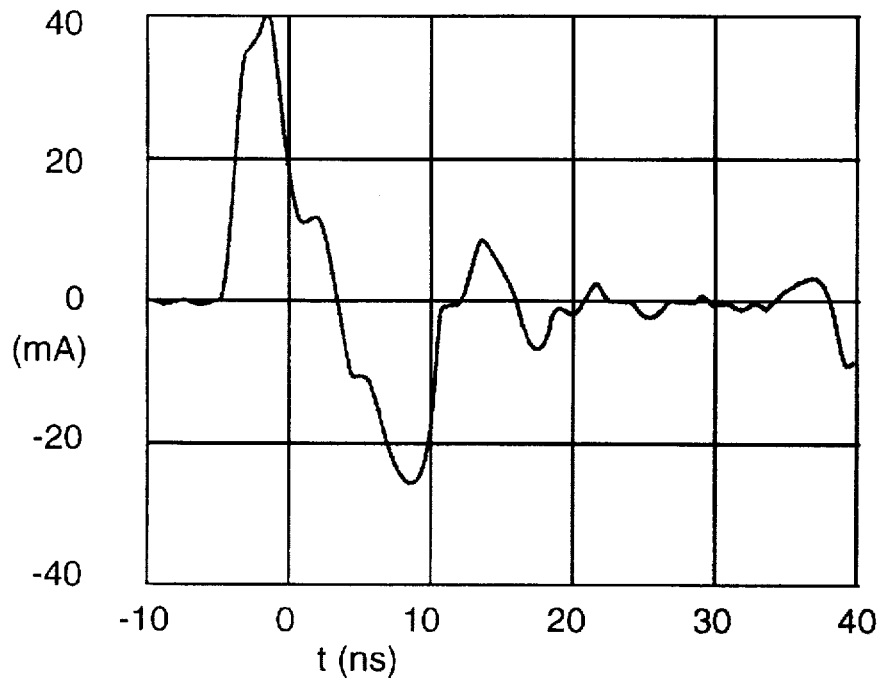
FIG. 11 shows current probe data with the probe in series with the receiver's pin.

FIG. 11 shows current probe data with the probe in series with the receiver's pin. The data show less drive current, more clamping, and less bandwidth than the simulations.

Figure 12:
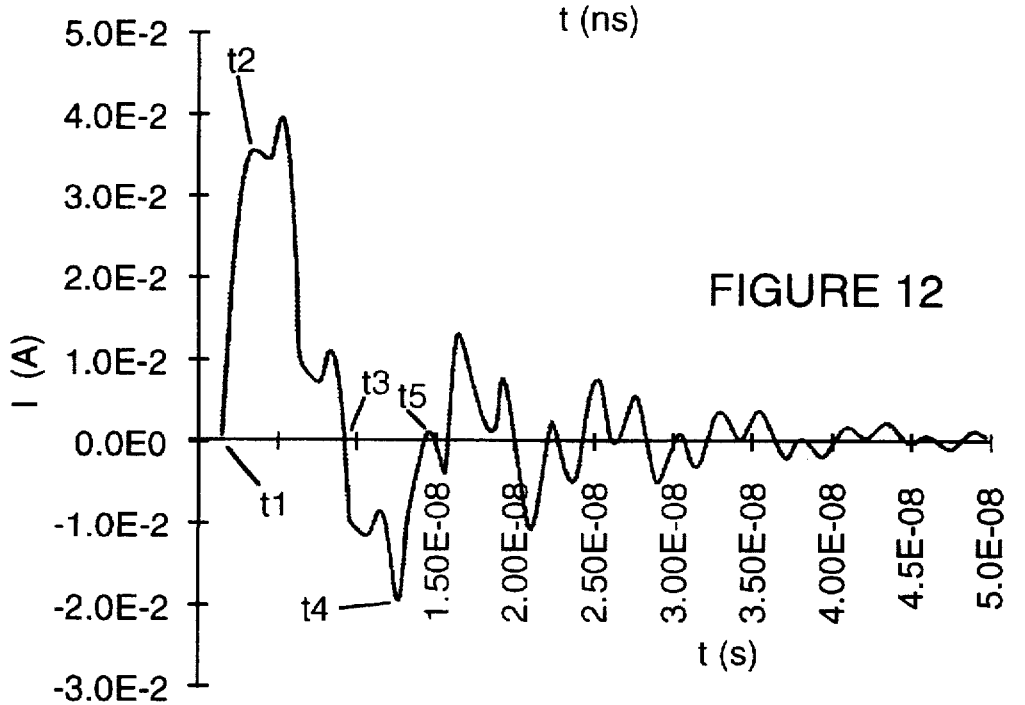
FIG. 12 is the net current modeled by HSPICE. (I(line), tt=5 ns.)

FIG. 12 is the net current modeled by HSPICE. It's easier to understand the circuit by following the current wave. The direction of positive current flows out of the load into the driver.

At t<0 the current in the net is zero. At t=0, the driver's input falls. The net delay is from t=0 to $t_1$. After $t_1$, the net stops behaving like a transmission line and begins to behave as an inductor. At $t_1$, current flows out of the capacitor into the driver. The current charges the net's inductance, and establishes a magnetic field. As the charge on the capacitor goes to zero, the voltage follows. At $t_2$, the capacitor's voltage is zero.

Figure 13:
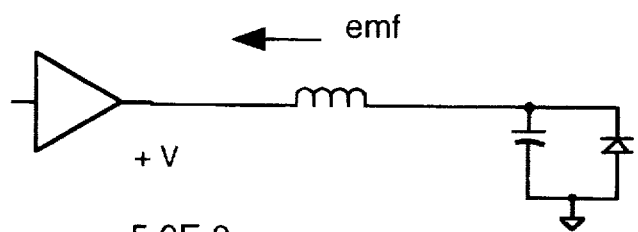
FIG. 13 shows the simplified circuit at $t_2$ as the inductor determines the voltage across the load.

From $t_1$ to $t_2$, the magnetic field strength increases. As the capacitor's voltage goes to zero, the current reaches a maximum and starts to decrease. The inductor uses energy stored in its magnetic field to develop an emf that opposes this decrease in current. ("Lenz's Law: The induced current will appear in such a direction that it opposes the change that produced it." D. Halliday and R. Resnick, *Fundamentals of Physics*. New York: John Wiley & Sons, Inc., 1981, p. 577.) At this point, the inductor determines the voltage across the load, as seen in FIG. 13. The load voltage starts to go negative with respect to the driver end. (In a battery, the emf vector points from the negative terminal to the positive terminal.)

Figure 14:
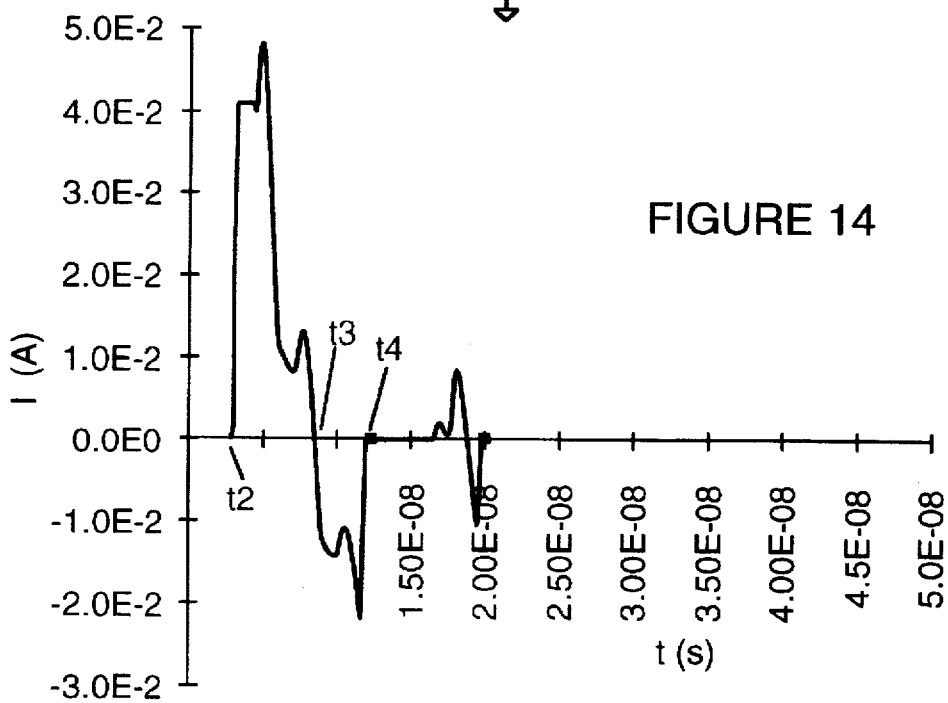
FIGS. 14 and 15 show the diode's current (I(diode), tt=5 ns) and the capacitor's current (I(cap), tt=5 ns).
Figure 15:
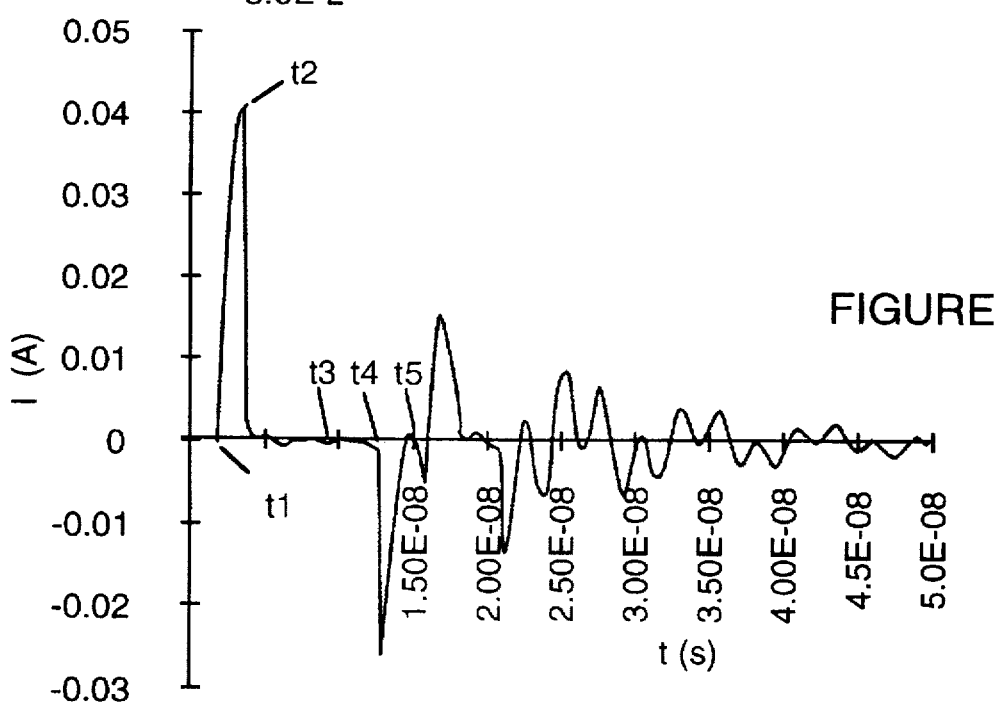

The load voltage continues to go negative until the clamp turns on at $t_2$. The capacitor current quickly drops to zero. FIGS. 14 and 15 show the diode's current and the capacitor's current. The inductor tries to maintain a positive current flow until $t_3$, when its magnetic field collapses.

At $t_3$, the load's voltage is still −0.7V. The current reverses direction, and starts to flow from the driver into the load. At $t_3$ as shown in FIG. 15, the current through the capacitor is still zero. Also, the current through the diode is opposite that of the forward bias condition. The diode's diffusion capacitance stores charge and allows current to flow in the reverse direction for a brief time.

Charge Storage and Transit Time

There are two types of capacitance associated with a p-n junction: the junction capacitance and the diffusion capacitance. The junction capacitance is a result of the dipole formed in the depletion region, and is dominant during steady state reverse bias. The diffusion capacitance, formed by injected minority carriers, is dominant during forward bias and during the transition from forward to reverse bias. B. G. Streetman, *Solid State Electronic Devices*. Englewood Cliffs, N.J.: Prentice-Hall, Inc., 1980, pp. 173–176.

HSPICE models diffusion capacitance as the transit time. The relationship is:

$$c_{dif} TT \, \partial id/\partial vd$$

Meta-Software, HSPICE *User's Manual Volume 2*. Campbell, Calif.: Meta-Software, Inc., 1992, Ch. 3 p. 19.

Where TT is the transit time, id is the diode current, and vd is the diode voltage. Charge storage is proportional to the transit time, and is zero when the current is not changing. Although this model doesn't take into account charge flow after the diode shuts off, it demonstrates the basic charge storage mechanism. B. G. Streetman, *Solid State Electronic Devices*. Englewood Cliffs, N.J.: Prentice-Hall, Inc., 1980, p 174.

During forward bias, electrons flow from the inductor to ground. When the electrons cross the junction, they become minority carriers in the p side. They have a concentration profile that is maximum at the junction, and exponentially decreases with distance from the junction. The n side has a similar distribution of holes.

At $t_3$, the inductor can no longer force current to flow. The load's negative bias is due to the stored minority carriers in the diode. The minority carriers in the diode recombine to bring the diode back to zero bias equilibrium. External charge flows through the load as a recombination current. The stored charge prevents the junction voltage from changing instantaneously, and shutting off the diode. Eventually, enough minority carriers recombine, the forward junction potential dissipates, and the diode turns off at $t_4$.

Unfortunately for the system, the recombination current charges the inductor, creating a magnetic field. The inductor tries to maintain a current flow into the load. After $t_4$, the diode is off, and current flows into the capacitor. This current charges the capacitor positive relative to ground. The capacitor stops charging when the magnetic field vanishes and the current drops to zero at $t_5$. The voltage across the capacitor is now at a maximum.

From this point on, the circuit behaves as a typical resonant circuit. Energy transfers between the capacitor's electric field and the inductor's magnetic field via an alternating current. The clamping in the system is mainly due to the driver's output impedance.

Conclusion

The recombination current is responsible for the excessive positive voltage across the capacitor. If the recombination current were zero, the discharging capacitor would still cause a ring, but of lower amplitude. (See FIG. 8.) The recombination current is a result of charge storage in the Vss clamp diode.

The solution is to keep the Vss clamps out of forward conduction. Driver sizing is the most effective means to accomplish this. Sizing the driver controls the current in a manner which can be predicted using simulation. Termination and multiple stubs can be of limited help.

XNS cannot model charge storage, and cannot accurately model clamp induced ringing. HPSICE can be used to model clamp induced ringing if a transit time is added for the clamp diode.

A general description of the device and method of using the present invention as well as a preferred embodiment of the present invention has been set forth above. One skilled in the art will recognize and be able to practice many changes in many aspects of the device and method described above, including variations which fall within the teachings of this invention. The spirit and scope of the invention should be limited only as set forth in the claims which follow.

What is claimed is:

1. A method of designing a CMOS input circuit with a clamp diode, said method comprising using a circuit simulation modeling program, modeling a CMOS output stage connected to a CMOS input stage, modeling a clamp diode connected between ground and the input of said CMOS input stage, and including in said modeling a modeling element to account for parasitic capacitance in said clamp diode, wherein said modeling element to account for parasitic capacitance in said clamp diode is modeling a selected transit time for said clamp diode.

2. A method of designing a CMOS input circuit with a clamp diode, said method comprising using a circuit simulation modeling program, modeling a CMOS output stage connected to a CMOS input stage, modeling a clamp diode connected between ground and the input of said CMOS input stage, and including in said modeling a modeling element to account for parasitic capacitance in said clamp diode wherein said modeling uses HSPICE.

* * * * *